United States Patent

Havemann et al.

(10) Patent No.: US 6,355,559 B1
(45) Date of Patent: Mar. 12, 2002

(54) PASSIVATION OF INLAID METALLIZATION

(75) Inventors: Robert H. Havemann, Garland;
Qi-Zhong Hong, Dallas, both of TX (US); Girish Dixit, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/706,275

(22) Filed: Nov. 3, 2000

Related U.S. Application Data

(60) Provisional application No. 60/166,531, filed on Nov. 18, 1999.

(51) Int. Cl.[7] .................................. H01L 21/4763
(52) U.S. Cl. ................ 438/643; 438/687; 438/653; 438/627
(58) Field of Search .................. 438/687, 643–644, 438/653–654, 627–628

(56) References Cited

U.S. PATENT DOCUMENTS 6,114,238 A * 9/2000 Liao ........................ 438/648
6,130,157 A * 10/2000 Liu et al. ................. 438/669
6,147,000 A * 11/2000 You et al. ................ 438/687

FOREIGN PATENT DOCUMENTS

JP          5347274    * 12/1993    ......... H01L/21/285

* cited by examiner

Primary Examiner—Charles Bowers
Assistant Examiner—Thanh Nguyen
(74) Attorney, Agent, or Firm—Jacqueline J. Garner; W. James Brady, III; Frederick J. Telecky, Jr.

(57) ABSTRACT

A method for forming a metal interconnect having a self-aligned transition metal-nitride barrier (124). After the metal interconnect lines (118) are formed, a transition metal (120) is deposited over the surface of the metal interconnect lines (118) and reacted in to form a metal-compound (122). The metal-compound (122) is then annealed in a nitrogen ambient to form a barrier layer (114) at the surface of the metal interconnect lines (118).

9 Claims, 2 Drawing Sheets

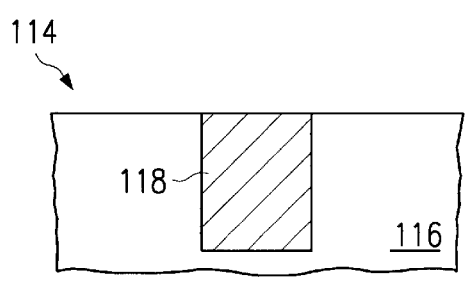 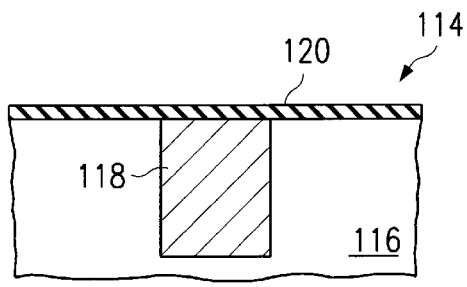
FIG. 4A    FIG. 4B
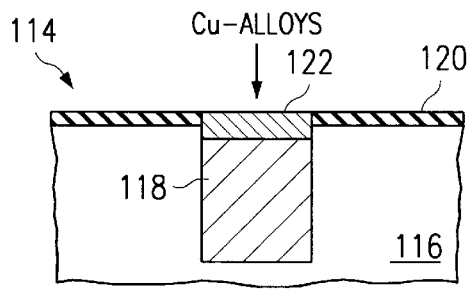 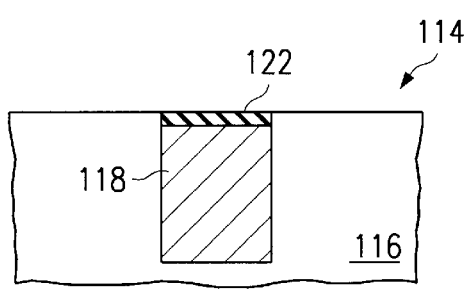
FIG. 4C    FIG. 4D
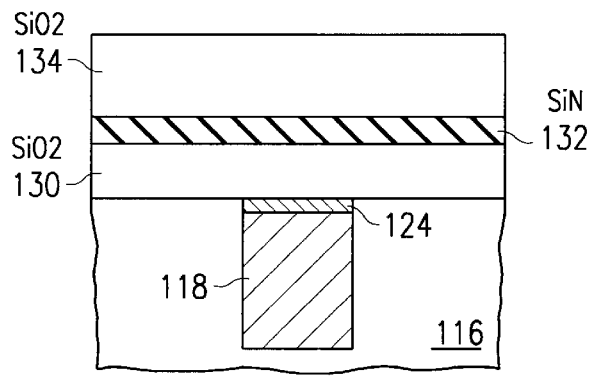
FIG. 5
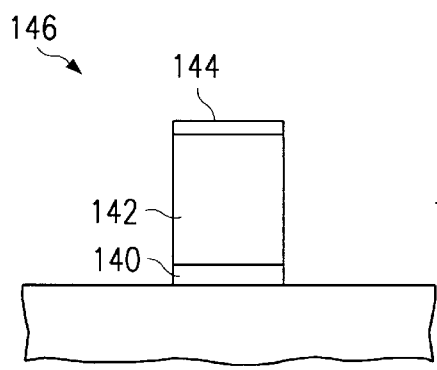 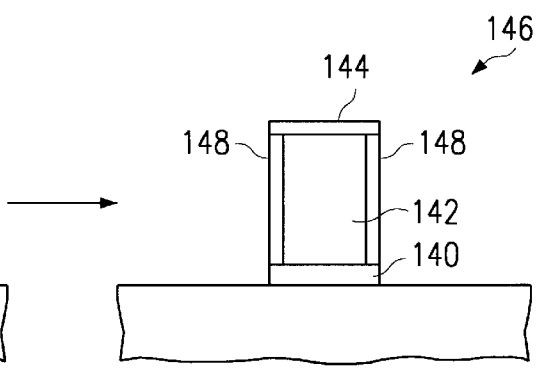
FIG. 6A    FIG. 6B

PASSIVATION OF INLAID METALLIZATION

This Application claims benefit of Provisonial No. 60/166,531 filed Nov. 18, 1999.

FIELD OF THE INVENTION

The invention is generally related to the field of forming interconnect layers in integrated circuits.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a conventional interconnect process, the aluminum (and any barrier metals) are deposited, patterned, and etched to form the interconnect lines. Then, an interlevel dielectric (ILD) is deposited and planarized. In a damascene process, the ILD is formed first. The ILD is then patterned and etched. The barrier layer and a copper seed layer are then deposited over the structure. The copper layer is the formed using the seed layer over the entire structure. The copper is then chemically-mechanically polished (CMP'd) to remove the copper from over the ILD 16, leaving copper interconnect lines 18 as shown in FIG. 1A. A metal etch is thereby avoided.

Next, a silicon nitride layer 20 is deposited over the copper 18 and ILD 16, as shown in FIG. 1B. Copper must be surrounded by a barrier to prevent it from diffusing into the surrounding dielectric. Unfortunately, the silicon nitride layer increases the line-to-line capacitance. In addition, the poor interface between silicon nitride (a dielectric) and copper (a conductor) results in poor adhesion and poor electromigration (copper electromigration via interface diffusion).

One method of overcoming the problems associated with silicon nitride is shown in FIGS. 2A–2C. In this process the CMP step is continued to recess the top of the copper interconnect line 18 below the surface of the ILD 16, as shown in FIG. 2A. Titanium nitride (TiN) 22 is then deposited over the structure as shown in FIG. 2B. A second CMP step is then used to remove the TiN 22 from over the ILD 16, as shown in FIG. 2C. TiN 22 provides a better interface to the copper 18 than silicon nitride. However, an even better interface is still desired. Furthermore, the amount of dishing (recessing) varies with feature size. In fact, there is very little dishing in narrow lines.

SUMMARY OF THE INVENTION

A method for forming a metal interconnect is disclosed herein. After the metal interconnect lines are formed, a transition metal is deposited over the surface of the metal interconnect lines and reacted to form a metal-compound (e.g., a metal alloy or other metal compound). The metal-compound is then annealed in a nitrogen ambient to form a barrier layer at the surface of the metal interconnect lines.

An advantage of the invention is providing a barrier for a metal interconnect with good adhesion and electromigration properties.

This and other advantages will be apparent to those of ordinary skill in the art having reference to the specification in conjunction with the drawings.

BRIEF DESCRIPTION OF THE DRAWINGS

In the drawings:

FIGS. 4A–4D are cross-sectional diagrams of the interconnect line of FIG. 3 at various stages of fabrication;

FIG. 5 is a cross-sectional diagram of the interconnect line of FIG. 3 with a etchstop layer formed thereover; and FIGS. 6A–6B are cross-sectional diagrams of the invention applied to a conventional subtractive interconnect.

DETAILED DESCRIPTION OF THE EMBODIMENTS

The invention will now be described in conjunction with a dual damascene copper interconnect process. It will be apparent to those of ordinary skill in the art that the benefits of the invention can be applied to other fabrication processes such as conventional subtractive (pattern and etch) processes and other interconnect materials.

Figure 1A:
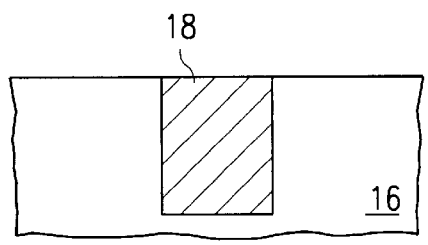
FIGS. 1A–1B are cross-sectional diagrams of a prior art dual damascene process using a silicon-nitride barrier at various stages of fabrication.
Figure 1B:
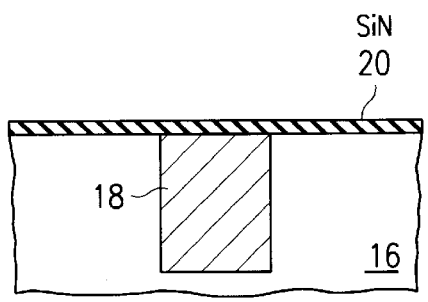
Figure 2A:
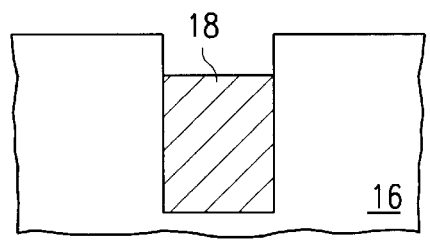
FIGS. 2A–2C are cross-sectional diagrams of a prior art dual damascene process using a TiN barrier at various stages of fabrication.
Figure 2B:
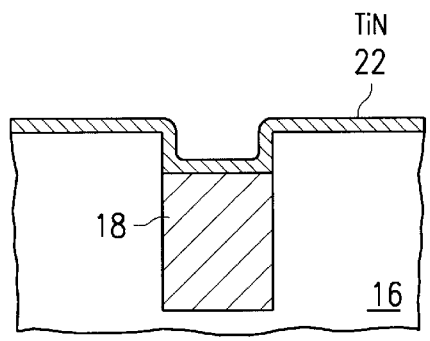
Figure 2C:
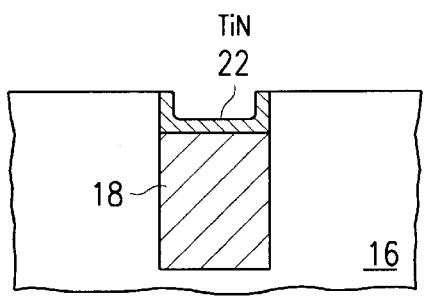
Figure 3:
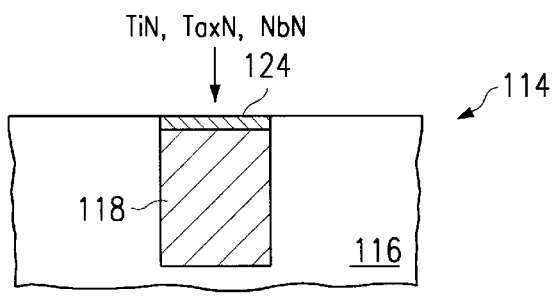
FIG. 3 is a cross-sectional diagram of an interconnect line having a self-aligned transition metal-nitride barrier layer according to the invention.

The invention uses a transition metal-nitride barrier 124 over the copper interconnect line 118, as shown in FIG. 3. The transition metal-nitride barrier 124 is self-aligned to the copper interconnect. Thus, there is no adverse impact on the line-to-line capacitance as in the prior art silicon nitride barrier. Furthermore, the transition metal-nitride barrier has good adhesion and electromigration properties. This is because the method of forming the barrier layer forms the interface with strong chemical bonding.

A method for forming the barrier layer 124 will now be discussed with reference to FIGS. 4A–4D. As shown in FIG. 4A, the semiconductor body 114 is processed through the formation of ILD 116 and copper interconnect line 118. Methods for forming the structure of FIG. 4A are known in the art. Semiconductor body 114 will typically contain transistors and other devices formed in a surface of a substrate or epitaxial layer as is known in the art. ILD 116 and copper interconnect line 118 may be part of one of several interconnect layers formed as part semiconductor body 114.

Referring to FIG. 4B, a transition metal 120 is deposited over the structure. Exemplary transition metals include Ti, Ta, Nb, and Mg. The thickness of transition metal 120 may be on the order of 50–500 Å.

Next, the transition metal 120 and copper line 118 are annealed to react the transistor metal and copper to form a copper-compound 122, as shown in FIG. 4C. The term copper-compound as used herein is meant to refer to copper-alloys as well as other copper compounds. Copper-compound 122 is formed only where copper 118 was exposed to transition metal 120. Thus, copper-compound is self-aligned to the copper line 118. The transition metal 120 does not react with ILD 116 and thus remains transition metal where not exposed to copper.

The anneal is performed in an inert ambient. As an example argon may be used. Nitrogen may not be used at this step because nitrogen is not inert in this instance because it reacts with the transition metal. The temperature may be in the range of 200° C.–500° C. The duration of the anneal is on the order of 30 minutes in a furnace or 1 minute in a RTP (rapid thermal processing) chamber. The anneal should result in a copper-compound of less than 500Å thick.

Referring the FIG. 4D, the unreacted transition metal 120 is removed. A selective dry or wet etch is used to remove the unreacted transition metal 120 but not remove the copper compound 122. As an example, a selective fluorine dry etch or a selective $H_2O_2$ wet etch may be used.

Next, a second anneal is performed in a nitrogen ambient. The nitrogen anneal incorporates nitrogen in to the copper-compound and drives out the copper back to the conductor below. The result is a transition metal-nitride barrier 124 as shown in FIG. 3. For example, if Ti was the transition metal deposited earlier, TiN is formed. If Ta was the transition metal deposited earlier, TaN is formed. If Nb was the transition metal deposited earlier, NbN is formed. If Mg was the transition metal deposited earlier, MgN is formed.

The conditions of the nitrogen anneal are similar to the conditions of the first anneal except that nitrogen is used instead of an inert gas. The temperature of the nitrogen anneal is in the range of 200° C.–500° C. The duration of the nitrogen anneal is on the order of 30 minutes in a furnace or 1 minute in a RTP (rapid thermal processing) chamber.

Transition metal-nitride 124 must be thick enough to act as a diffusion barrier to prevent copper from out-diffusing into the surrounding layers. However, transition metal-nitride 124 will typically remain less than 500Å. The thickness of the transition metal-nitride is determined by the thickness of the copper-compound 122. The thickness of copper-compound 112 is, in turn, dependent on the thickness of transition metal 120 and the first anneal conditions. Thus, the thickness of the transition metal 120 and the first anneal conditions are chosen to accomplish the desired thickness in the resulting transition metal-nitride 124.

The silicon-nitride barrier of the prior art was sometimes used as an etchstop in forming subsequent metal interconnect layers. An etchstop over the entire wafer is beneficial in the case of misaligned vias. Methods are known in the art for providing a suitable etchstop. For example, a silicon nitride layer 132 may be sandwiched between oxide layers 130 and 134 to provide an etchstop, as shown in FIG. 5. After etching a via through ILD oxide 134 and stopping on silicon nitride 132, silicon nitride 132 may be etched followed by a short, timed etch of thinner oxide 130. If the via is misaligned, only a small amount of ILD 116 would be removed during the short, timed etch.

The invention may also be applied to conventional subtractive (pattern and etch) interconnects. The lower barrier 140, metal 142 and upper barrier 144 are patterned and etched as shown in FIG. 6A to form interconnect line 146. The process of the invention is then applied to form barriers 148 one the sides of metal 142, as shown in FIG. 6B. Similar to that described above, the transition metal is deposited over the interconnect line 146 and then annealed. During the anneal, the transition metal reacts with the exposed metal to form a metal compound. In this case, the exposed metal is on the sides instead of the upper surface. The unreacted transition metal is the selectively removed and a second, nitrogen anneal is performed. The nitrogen is incorporated in the metal compound and the metal diffuses out resulting in the transition metal-nitride barrier 148.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an integrated circuit, comprising the steps of:

forming a metal interconnect line over a semiconductor body;

forming a transition metal over said metal interconnect line;

annealing said transition metal to react a portion of said transition metal with said metal interconnect line to form a metal-compound self-aligned to said metal interconnect line;

removing unreacted portions of said transition metal;

annealing said metal compound in a nitrogen ambient to convert said metal-compound to a transition metal-nitride barrier.

2. The method of claim 1, wherein said metal interconnect line comprises copper.

3. The method of claim 1, wherein said transition metal is selected from the group consisting of Ti, Ta, Nb, and Mg.

4. The method of claim 1, further comprising the step of forming a dielectric layer, said metal interconnect layer embedded in said dielectric layer.

5. The method of claim 1, wherein said transition metal-nitride barrier is located on an upper surface of said metal interconnect layer.

6. The method of claim 1, wherein said transition metal-nitride barrier is located on a sidewall of said metal interconnect layer.

7. The method of claim 1, wherein said annealing said metal compound step occurs at a temperature in the range of 200° C.–500° C.

8. The method of claim 1, wherein said annealing said transition metal step occurs in an inert ambient.

9. The method of claim 1, wherein said annealing said transition metal step occurs in argon.

* * * * *